United States Patent [19]
Arends et al.

[11] Patent Number: 5,682,340
[45] Date of Patent: Oct. 28, 1997

[54] LOW POWER CONSUMPTION CIRCUIT AND METHOD OF OPERATION FOR IMPLEMENTING SHIFTS AND BIT REVERSALS

[75] Inventors: John Arends; Jeffrey W. Scott, both of Austin, Tex.

[73] Assignee: Motorola, Inc., Schaumburg, Ill.

[21] Appl. No.: 497,827

[22] Filed: Jul. 3, 1995

[51] Int. Cl.[6] .............................. G06F 7/00; G06F 15/00; G11C 19/00
[52] U.S. Cl. .................... 364/715.08; 377/54; 377/69; 377/73; 377/74; 395/775
[58] Field of Search .................... 364/715.04, 715.08; 395/775, 800, 310; 377/33, 41, 54, 69, 73, 74

[56] References Cited

U.S. PATENT DOCUMENTS

| | | | |
|---|---|---|---|
| 3,768,077 | 10/1973 | Nier et al. | 395/775 |
| 4,782,457 | 11/1988 | Cline | 364/715.04 |
| 4,811,369 | 3/1989 | Barnard et al. | 377/33 |
| 4,829,460 | 5/1989 | Ito | 364/715.08 |
| 4,984,189 | 1/1991 | Neki | 395/775 |
| 5,132,898 | 7/1992 | Sakamura et al. | 395/310 |
| 5,265,259 | 11/1993 | Satou et al. | 395/800 |
| 5,297,070 | 3/1994 | Hua et al. | 364/726 |

*Primary Examiner*—Reba I. Elmore
*Assistant Examiner*—Emmanuel L. Moise
*Attorney, Agent, or Firm*—Keith E. Witek

[57] ABSTRACT

The present invention describes a circuit (10) and associated method of operation for implementing bit reversals and shifts of an input data. The circuit (10) includes a plurality of input lines (12), a plurality of output lines (14), a plurality of shifting transistors (16), a plurality of bit reversal transistors (20), control lines (18) and (22) for each, and a controller (24). The plurality of shifting transistors (16) operably couple the input lines (12) to the output lines (14) such that the controller (24) may selectively operate the shifting transistors (22) to produce shifted outputs of the input data $D_0$ through $D_3$ on the output lines (14). The controller (24) selectively operates the bit reversal transistors (20) to produce a bit reversed representation of the input data on the output lines (14). Precharge circuit (30) precharges the output lines (14) so that they may be statically driven. The circuit (10) may include multiplexors (25), (26), and (27) to enable arithmetic shifts.

31 Claims, 4 Drawing Sheets

FIG.1

|     | SHIFT 0 | SHIFT 1 | SHIFT 2 | SHIFT 3 |
|-----|---------|---------|---------|---------|
| RL  | $SL_0$  | $SL_1, SR_3$ | $SL_2, SR_2$ | $SL_3, SR_1$ |
| LSL | $SL_0$  | $SL_1$  | $SL_2$  | $SL_3$  |
| LSR | $SL_0$  | $SR_1$  | $SR_2$  | $SR_3$  |
| ASR | $SL_0$  | $SR_1, SL_3, A_0$ | $SR_2, SL_2, A_0, A_1$ | $SR_3, SL_1, A_0, A_1, A_2$ |
| BR  | BR      | N/A     | N/A     | N/A     |

FIG.2

|     | $IR_0$ | $IR_1$ | $IR_2$ | $IR_3$ | $IL_2$ | $IL_1$ | $IL_0$ |
|-----|--------|--------|--------|--------|--------|--------|--------|
| RL  | $D_0$  | $D_1$  | $D_2$  | $D_3$  | $D_3$  | $D_2$  | $D_1$  |
| LSL | $D_0$  | $D_1$  | $D_2$  | $D_3$  | 0      | 0      | 0      |
| LSR | $D_3$  | 0      | 0      | 0      | $D_2$  | $D_1$  | $D_0$  |
| ASR | $D_3$  | $D_3$  | $D_3$  | $D_3$  | $D_2$  | $D_1$  | $D_0$  |
| BR  | $D_0$  | $D_1$  | $D_2$  | $D_3$  | $D_3$  | $D_2$  | $D_1$  |

LOW POWER CONSUMPTION CIRCUIT AND METHOD OF OPERATION FOR IMPLEMENTING SHIFTS AND BIT REVERSALS

TECHNICAL FIELD OF THE INVENTION

This invention relates generally to integrated circuitry and more particularly to a circuit and method of operation for performing both shifts and bit reversals of input data to produce output data.

BACKGROUND OF THE INVENTION

Today's complex digital integrated circuitry performs many functions relating to data processing. Particular applications using integrated circuitry include the transmission and receipt of signals and the processing of signals. In information transfer systems such as digital telephone systems and digital paging systems, for example, analog data is converted to a digital format, transmitted at a transmitting location, received at a receiving location, and manipulated in order to process the data and convey information contained in the data.

In a typical digital telephone system, analog data is received from a user and converted to an equivalent digital format. The equivalent digital format data is typically represented as a time domain equivalent of the analog data. As one skilled in the art will readily appreciate, analog data may be represented by a stream of bits or a stream of multiple bits. If the analog data is sampled at a sufficient sampling frequency, according to the sampling theorem, the bit stream will accurately include all information that was contained in the analog data.

For efficiency in data transmission and storage, digital data is often compressed into a compressed format. One common technique for compressing data includes converting digital data from a time domain format to a frequency domain format. As is known in the art, the fast Fourier transformation (FFT) is commonly used to transform digital data from the time domain to digital data in the frequency domain. The Fourier transform is a well-known algorithm that may be implemented through a set of mathematical calculations. The Fourier transformation is based upon the convolution of data in the time domain to produce a frequency domain equivalent, and thus requires significant multiplication and addition operations in order to be used. Once produced, digital data in the frequency domain represents the frequency spectrum of the analog signal at a specific time period. Thus, a sequence of digital data in the time domain may be converted to a sequence of digital data in the frequency domain that contains equivalent information. Many useful operations may be performed upon the data once it has been converted to its frequency domain equivalent. For example, filtering operations, windowing operations, and other mathematical operations may be performed upon the frequency domain data.

In many applications, digital data is also filtered to remove sampling noise, quantization noise, and various other noise components. The operations required to perform the filtering of the digital data typically include large numbers of multiplications and additions. However, the filtering of the digital data often decreases the processing requirements in other portions of the integrated circuitry.

Various other operations may be performed on the digital data during the processing of the data. These operations as well may require significant multiplication and addition operations. As is known in the art, mathematical addition operations are performed using adders. Multiplications are typically performed using algorithms, such as the modified Booth's algorithm, that include various shift operations and addition operations. The resultant of the shift operations and the addition operations yields a value equivalent to a multiplied value. Shifters are known in the art and perform shifting operations such as logical shifts, arithmetic shifts, and rotate shifts.

Mathematical operations, such as the FFT, however, require even more complex mathematical operations. During certain steps in the FFT, the algorithm requires that a bit reversed representation of the digital input data be produced so that the bit reversed representation may multiplied by another value. Thus, circuitry for performing the FFT must include circuitry that performs a bit reversal of input data. Because other mathematical operations performed on data in the frequency domain require the shifting of data as well as the bit reversing of data, circuitry and associated methods of operation have been developed to implement such shifting of data and bit reversing of data.

For example, U.S. Pat. No. 4,811,369 to Barnard, et. al. describes a bit reversing and shifting apparatus that provides either normal digital data or a bit reversed representation of the digital data to a shifter which performs shifting operations. The Barnard, et. al. apparatus, however, produces the bit reversed representation of the input data by simply hard wiring the input lines in both a normal bit order and the reverse bit order to a multiplexor, the output of which provides input to the shifter. Thus, the bit reversal circuitry or Barnard, et. al. requires additional wiring and a multiplexor. These additional elements consumed power, resulted in increased circuit time delay, and required additional surface area to implement.

U.S. Pat. No. 4,984,189 to Neki describes a combination bit reversing and data shifting circuit. The bit reversing circuitry of Neki produces either a normal or a bit reversed representation of input data using a transistor array. The output of the transistor array provided input to the data shifter. Thus, the circuitry that performed the bit reversal in the Neki device was also isolated and separate from the shifter thereby requiring additional surface area and components.

Thus, the prior bit reversal circuitry required additional surface area, additional time delay, and additional electrical components to perform the bit reversal, with the additional components performing no other function. The additional requirements therefore increased the complexity, surface area, and power consumption of the bit reversal and shifting circuit. In today's modern low power devices that employ the bit reversal and shifting circuitry, power consumption and surface area must be minimized.

Thus, there is a need in the art for a bit reversal and shifting circuit that has minimized power consumption and integrated circuit substrate surface area.

DETAILED DESCRIPTION OF THE DRAWINGS

The present invention described herein is a circuit and associated method of operation for implementing bit reversals and shifts of an input data. The circuit includes a plurality of input lines, a plurality of output lines, a plurality of shifting transistors, a plurality or bit reversal transistors, control lines for each type of transistor, and a controller. In accordance with the present invention, the plurality of shifting transistors operably couple the input lines to the output lines such that the controller may selectively operate the shifting transistors to produce shifted outputs of the input data on the output lines. Further, the controller selectively operates the bit reversal transistors to produce a bit reversed representation of the input on the output lines. The bit reversal transistors and the shifting transistors share the input lines and the output lines, unlike the prior art, in order to minimize the area of the circuit while increasing the functionality of the circuit thereby conserving power. Thus, the circuit of the present invention provides important benefits not realized by the prior circuits having separate bit reversal components and shifting components.

Figure 1:
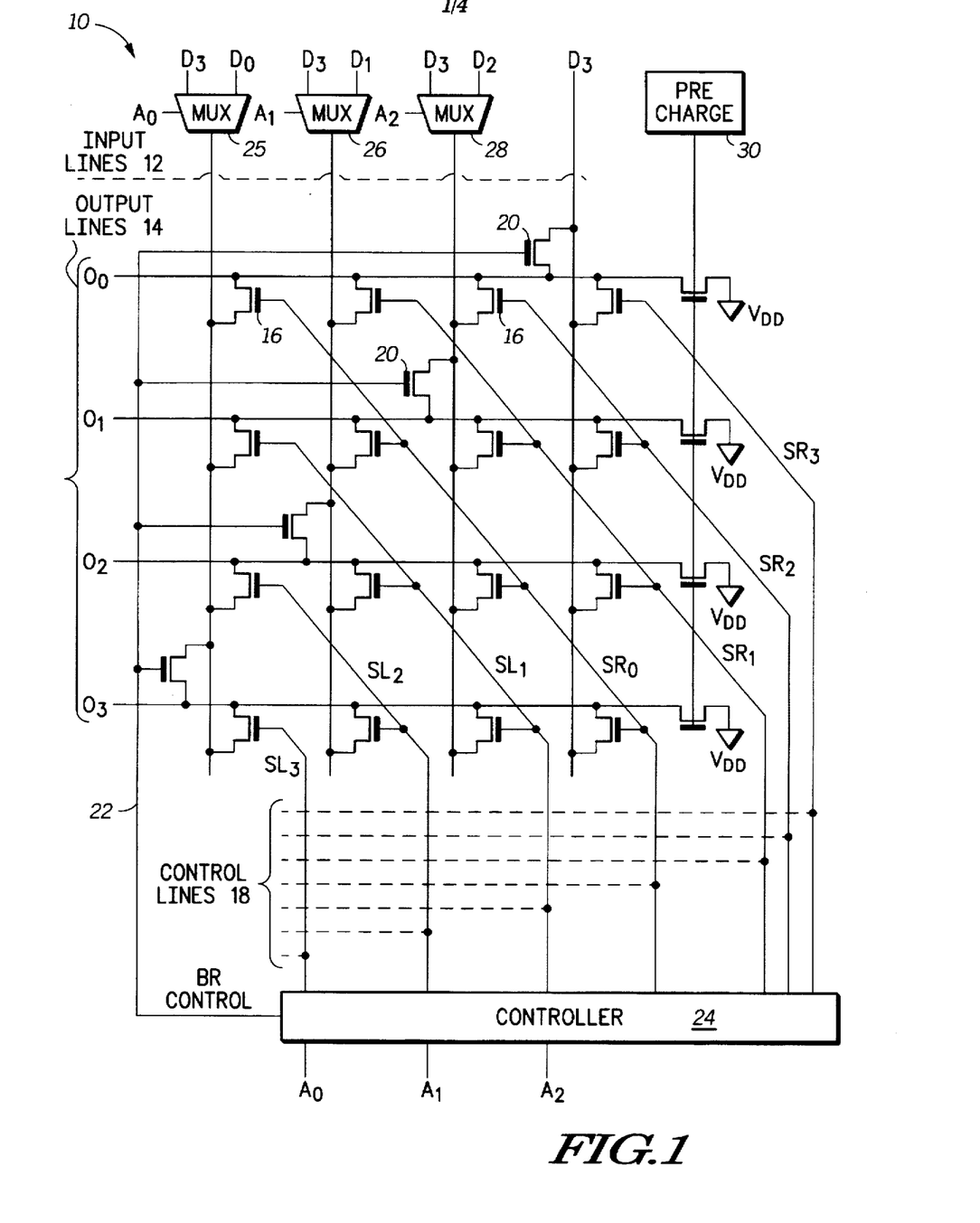
FIG. 1 illustrates a schematic diagram of a circuit for selectively implementing shifts and bit reversals of input data in accordance with the present invention.

FIG. 1 illustrates a circuit 10 for selectively implementing shifts and bit reversals of input data to produce output data. The circuit 10 comprises a plurality of input lines 12, a plurality of output lines 14, a plurality of shifting transistors 16, a plurality of shift control lines 18, a plurality of bit reversal transistors 20, a bit reversal control line 22, and a controller 24.

The plurality of input lines 12 receive input data represented as $D_0$ through $D_3$. Each of the input lines 12 receives one bit of the input data. The plurality of output lines 14 ($O_0$ through $O_3$) provide output data that may be used by subsequent circuitry connected to the circuit 10 in the present invention. Each of the output lines 14 produces one bit of the output data, represented as $O_0$ through $O_3$.

The plurality of transistors include both the plurality of shifting transistors 16 and the plurality of bit reversal transistors 20. The transistors 16 and 20 operably couple the input lines 12 to the output lines 14 in a selective manner to produce either a bit reversed representation of the input data on the output lines 14 or a shifted representation of the input data on the output lines 14. In accordance with the present invention, the transistors are selectively operated by the controller 24 to perform the desired shifting or bit reversal operation. Controller 24 is a bit reveral controller and a shift/rotate controller.

The plurality of shifting transistors 16 operably couple the plurality of input lines 12 to the plurality of output lines 14. Each of the plurality of shifting transistors 16 operably couples one of the plurality of input lines 12 to one of the plurality of output lines 14. As one skilled in the art will readily appreciate, only a single input line 12 provide its data to each one of the output lines 14 during any operation of the circuit 10 in the present invention. In accordance with the shifting operations and bit reversal operations performed by the circuit 10 of the present invention, each input data bit, $D_0$ through $D_3$ must correspond to at most one bit of the output data, $O_0$ through $O_3$.

The plurality of shift control lines 18, represented as $SL_0$ through $SL_3$ and $SR_1$ through $SR_3$, are operably coupled to the plurality of shifting transistors 16. The shift control lines 18 operably couple such that they provide the gating signals to the shifting transistors 16. Preferably, the shifting transistors 16 comprise N-channel field effect transistors such that a logic high level on the gate of the shifting transistors 16 enables the shifting transistors 16 to conduct and pass data from the input lines 12 to the output lines 14. In an alternate form, P-channel transistors can replace the N-channel transistors or transmission gates can be used in place of the N-channel transistors used herein to reduce threshold voltage drops when transferring signals from input data lines to output lines. A transmission gate is a parallel-coupled N-channel and P-channel transistor pair.

The plurality of bit reversal transistors 20 operably couple the plurality of input lines 12 to the plurality of output lines 14. The bit reversal transistors 20 are gated by a bit reversal signal coupled to the gates of the bit reversal transistors 20. The bit reversal control line 22 receives the bit reversal signal BR from the controller 24 and provides the bit reversal signal to the bit reversal transistors 20. Preferably, the bit reversal transistors 20 also comprise N-channel field effect transistors such that a logic high level on the bit reversal control line 22 enables the bit reversal transistors 20 to conduct and couple data on the input lines 12 to data on the output lines 14.

As is shown in FIG. 1 and as one skilled in the art will readily appreciate, the bit reversal transistors 20 couple the input lines 12 to the output lines in a fashion to produce a bit reversed representation of the input data on the plurality of output lines 14. FIG. 1 illustrates a situation wherein there are four input lines 12 and four output lines 14. Thus, it is illustrated in FIG. 1, a bit reversal of the input data is accomplished simply by coupling input data line $D_3$ to output line $O_0$, input line $D_2$ to output line $O_1$, input line $D_1$ to output line $O_2$, and input line $D_0$ to output line $O_3$.

However, the teachings of the present invention are not limited to a four bit input data and can comprise any number of input and output bits to accommodate any bit-wide architecture. For example, in a common implementation, there would be either 16, 24, 32, or 64 input lines 12 and respectively 16, 24, 32, or 64 output lines 14. In such a situation, the number of bit reversal transistors 20 would be equal to the number of input lines 12 and the number of output lines 14 while the number of shifting transistors 16 would be equal to the number of input lines times the number of output lines in the circuit 10. Thus, the teachings of the present invention may be translated to any size of input data and output data.

Controller 24 is operably coupled to the plurality of shift control lines 18 and the bit reversal control line 22. The controller 24 provides the shift control signals via the shift control lines 18 to selectively enable the shifting transistors 16 to provide a shifted representation of the input data to the plurality of output lines 14. Further, the controller 24 selectively provides the bit reversal signal BR to the bit reversal control line 22 to cause the bit reversal transistors 20 to produce at bit reversed representation of the input data on the output lines 14.

The circuit 10 also preferably includes pre-charged circuitry 30 that pulls the output lines 14 to a logic high level prior to an operation of the circuit 10. In this fashion, the data on the output lines 14 will retain a logic high level unless they are pulled low via the data on the input lines 12. As one skilled in the art will readily appreciate, the input lines 12 are driven statically such that they are capable of pulling the output lines 14 low during an operation of the circuit.

The circuit 10 of the present invention also includes a first multiplexor 25, a second multiplexor 26, and a third multiplexor 28. The first multiplexor 25 selectively multiplexes the first data bit $D_0$ and the fourth data bit $D_3$ to provide input data to the first input line 12. The second multiplexor 26 selectively multiplexes the second data bit $D_1$ and the third data bit $D_3$ to provide input data to the second input line 12. The third multiplexor 28 selectively multiplexes the third data bit $D_2$ and the third data bit $D_3$ to provide input data to the third input line 12. Such a multiplexing of data is required for the arithmetic shifting operations performed by the circuit 10. In this situation, the bit representing the sign of the input data, $D_3$, must be provided as one of the bits of the shifted data produced in the output lines 14. For example, a bit pattern 10101010 which is shifted arithmetically 2 positions to the right would result in an output value of 11101010. The '1' sign bit is preserved as the other bit values shift right. Control signal $A_0$ produced by the controller 24 selectively multiplexes data bits $D_3$ and $D_0$ to the first input line 12. Control signal $A_1$ produced by the controller 24 selectively multiplexes data bits $D_3$ and $D_1$ to the second input line 12. Control signal $A_2$ produced by controller 24 selectively multiplexes data bits $D_3$ and $D_2$ to the third input line 12. In all shifting operations except for an arithmetic shift right, input data will be provided directly to the input lines 12.

Thus, the circuit 10 for selectively implementing shifts and bit reversals of input data provides important benefits not provided by previous circuits. Because the bit reversal transistors 20 and the shifting transistors 16 operate within the same array of input lines 12 and output lines 14, a separate bit reversal circuit is not required to implement the bit reversal functions. Thus, the area required by the circuit 10 for performing identical functions is significantly decreased as compared to prior circuits. Further, because common output lines 14 provide both bit reverse data and shifted data, a single pre-charge circuit 30 may be employed for both bit reversal operations and shifts therefore reducing power consumption. Further, the common control provided by controller 24 in the operation of circuit 10 reduces the complexity required to perform the various operations of circuit 10. In addition, less circuitry in series is needed and therefore the time delay or propagation delay of the circuitry can be optimized or improved.

Figure 2:
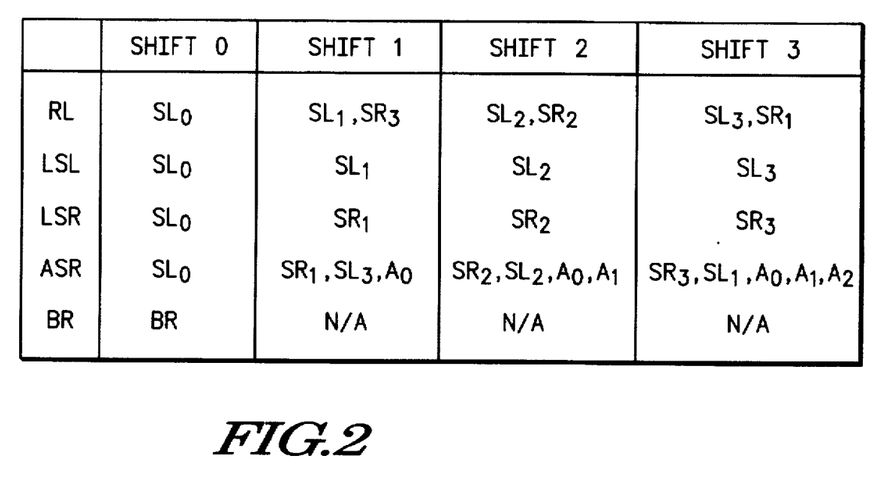
FIG. 2 illustrates a logic table for implementing shifts and bit reversals in accordance with the circuit of FIG. 1.

FIG. 2 illustrates a logic diagram showing the control signals provided to the shifting transistors 16, the bit reversal transistors 20, and the multiplexors 25, 26 and 28 during various operations of the circuit 10. During a rotate left operation, represented by RL, various control signals are provided to the circuit 10 illustrated in FIG. 1. For example, if a shift magnitude of 0 in a rotate left operation is desired, only control line $SL_0$ is enabled. In this fashion, $D_0$ is provided to output $O_0$, data $D_1$ provided to output $O_1$, data $D_2$ is provided to $O_2$, and data $D_3$ is provided to $O_3$. Thus, a magnitude shift of 0 of the RL operation simply provides the input data provided on the input lines 12 to the output lines 14. During a magnitude shift of 1 of a rotate left operation, control line $SL_1$ and $SR_3$ are enabled. Thus, $D_2$ is provided to $O_3$, $D_1$ is provided to $O_2$, $D_0$ is provided to $O_1$, and $D_3$ is provided/rotated to $O_0$ performing the RL shift magnitude 1 operation. An RL operation with a shift magnitude 2 requires that $SL_2$ and $SR_2$ are enabled. In this fashion, $D_1$ is provided $O_3$, $D_0$ is provided to $O_2$, $D_3$ is provided to $O_1$, and $D_2$ is provided to $O_0$. During a rotate left operation of magnitude 3, $SL_3$ and $SR_1$ are enabled to provide the required shift. Thus, $D_0$ is provided $O_3$, $D_1$ is provided to $O_0$, $D_2$ is provided to $O_1$, and $D_3$ is provided $O_2$.

A logical shift left operation is represented as LSL. As one skilled in the art will readily appreciate, an LSL operation having a shift magnitude 0 simply requires the enablement of control $SL_0$. An LSL operation having a shift magnitude of 1 requires an enablement of control line $SL_1$. During an LSL operation, output lines 14 that do not receive data due to the logical shift function, are provided with logical 0 data. Circuitry that provides logical 0 data to the respective output line 14 is either provided on the input side of the circuit 10 or the output side of the circuit 10 but is not shown in FIG. 1. Such circuitry provides the logical 0 portions of the data. Because the implementation of such circuitry is known in the art, it is not further described herein.

During an LSL operation of the circuit 10 with a shift magnitude of 1, control line $SL_1$ is enabled. During an LSL operation with a shift magnitude of 2, control line $SL_2$ is enabled, and during an LSL operation with a shift magnitude of 3, control line $SL_3$ is enabled. Thus, after the LSL operations, those output lines 14 that do not receive a portion of the input data will be provided with logic 0 values via the additional circuitry not herein described. This circuitry to provide a logic zero may simply be a set of weak pull-down resistive devices (like resistors or transistors) wherein a each weak pull-down resistive device connects between GND (ground) and a single unique output line. These weak pull-down resistive devices may be selectively enabled only on a LSL instruction. Other logic gate implementations or multiplexor implementations of providing a logic 0 can be used.

A logical shift right, or LSR operation, requires a certain enablement of control lines 18 of the circuit 10. With respect to LSR operations with particular shift magnitudes, a LSR having a shift magnitude of 0 requires simply the enablement of control line $SL_0$, a LSR having a shift magnitude of 1 requires the enablement of control line $SR_1$, a LSR having a shift magnitude of 2 requires an enablement of control line $SR_2$, while a LSR having a shift magnitude of 3 requires the enablement of control line $SR_3$. The LSR operations performed by circuit 10 also require the insertion of logical 0 data on those output lines 14 not receiving data from input lines 12. For example, a LSR operation having a shift magnitude of 3 provides output line $O_0$ with data $D_3$. However, output lines $O_0$, $O_1$, and $O_3$ are not coupled to any of the input lines 12. Thus, the additional circuitry not shown explicitly in FIG. 1 provides logic 0 values to output lines $O_1$, $O_2$, and $O_3$ to provide the correct shifted data as discussed above for the LSL instructions.

An arithmetic shift right (ASR) operation fills in the sign bits of the shifted data with the sign bit of the input data. As with the other shift magnitude 0 operations, an ASR operation having a shift magnitude of also requires the enablement of control line $SL_0$. In order to perform an ASR operation having a shift magnitude of 1, control lines $SR_1$ and $SL_3$ are enabled as is multiplex control line $A_0$. In this fashion, input data $D_1$ is provided to output line $O_0$, input data $D_2$ is provided to output line $O_1$, and input data $D_3$ is provided to output line $O_2$. Further, the operation of multiplexor 25 with signal $A_0$ provides input data $D_3$ to output line $O_3$. Thus, the sign bit of the input data, $D_3$ is provided to the output line $O_3$ as a sign bit extension in order to preserve the sign bit of the input binary number.

An ASR operation having a shift magnitude of 2 requires the enablement of control lines $SR_2$ and $SL_2$. Further, the operation requires enablement of multiplexor 25 and multiplexor 26 via multiplexor control lines $A_0$ and $A_1$ in order to provide the sign bit $D_3$ of the input data to output bits $O_3$ and $O_2$. An ASR operation having a shift magnitude of 3 requires the enablement of control lines $SR_3$ and $SL_1$ as well as the enablement of multiplex control lines $A_0$, $A_1$, and $A_2$.

As one skilled in the art will readily appreciate, the operation of the control lines and the multiplex control lines causes the circuit 10 to perform the ASR operation of a shift magnitude 3 with the necessary sign bit filling.

The operation of circuit 10 in order to provide a bit reversed representation of the input data to the output lines simply requires an enablement of the bit reversal signal BR on the bit reversal control line 22. The enablement of the bit reversal control line 22 causes each of the bit reversal transistors 20 to conduct and therefore provide a bit reverse representation of the input data $D_0$ through $D_3$ to the output lines $O_0$ to $O_3$. As one skilled in the art will readily appreciate, the teachings of the present invention with relation to the shifting operations may be readily applied to circuits having a greater number of data bits and output bits. The control of such a circuit with an increased number of bit capability may be implemented through teachings known in the art. Further, shifting operations other than those described herein may be performed by selectively controlling the operation of the circuit. For example, rotate right shifts may also be performed using the circuitry 10 of the present invention. Such additional shifting operations are not further described herein since they are easy to implement given the teachings herein.

Figure 3:
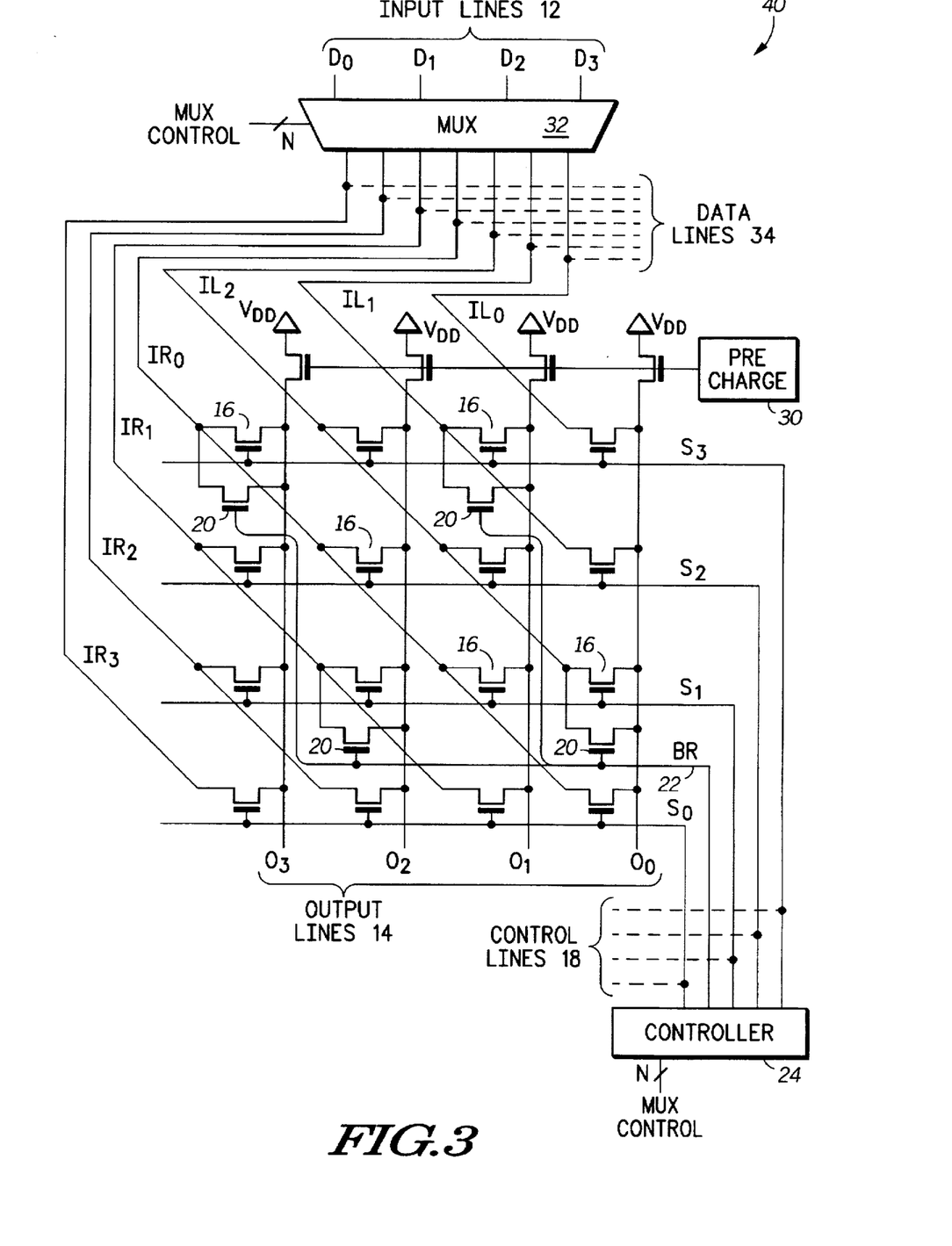
FIG. 3 illustrates an alternate circuit for selectively implementing shifts and bit reversals of input data in accordance with the present invention.

FIG. 3 illustrates an alternative circuit 40 for selectively implementing shifts and bit reversals of input data. The circuit 40 preferably comprises a plurality of input lines 12, a multiplexor 32, a plurality of data lines 34, a plurality of output lines 14, a plurality of shifting transistors 16, a plurality of shift control lines 18, a plurality of bit reversal transistors 20, a bit reversal control line 22, and a controller 24. The numbering conventions established with reference to FIG. 1 are maintained with reference to FIG. 3 with those elements having common functionality retaining common numbering.

The plurality of input lines 12 receive data $D_0$ through $D_3$. FIG. 3 illustrates a four bit circuit 40. However, the teachings illustrated in FIG. 3 could readily be applied to circuitry having a wider bit capability such as 16 bits, 32 bits, 64 bits, and so forth depending upon the particular application. The multiplexor 32 operably couples to the plurality of input lines 12 and selectively multiplexes the input data $D_0$ through $D_3$ depending upon a shift operation to be performed. The multiplexor 32 produces a plurality of output bits coupling directly to the data lines 34 with each of the plurality of data lines 34 receiving one bit from the multiplexor 32.

The plurality of shifting transistors 16 operably couple the plurality of data lines 34 to the plurality of output lines 14. Each of the plurality of shifting transistors 16 operably couples one of the data lines 34 to one of the plurality of output lines 14. Each of the plurality of output lines 14 provides a bit of output data. The output data illustrated in FIG. 3 is represented by $O_0$ through $O_3$.

The plurality of shift control lines 18 are represented as $S_0$ through $S_3$ and provide the control signals to the shifting transistors 20. The control signals $S_0$ through $S_3$ selectively enable the operation of the shifting transistors 16 to perform the desired shifting operation.

Each of the plurality of bit reversal transistors 16 operably couples one of the data lines 34 to one of the plurality of output lines 14. The bit reversal transistors 20 are enabled by bit reversal signal BR coupled via reversal control lines 22. The controller 24 provides the bit reversal control signal to the plurality of bit reversal transistors 20. Upon receipt of the bit reversal control signal, the bit reversal transistors 20 selectively couple the data lines 34 to the output lines 14 to provide a bit reverse representation of the input data to the plurality of output lines 14. Of course, a correct operation of the multiplexor 32 must also occur in order to provide the bit reversed representation on the output lines 14.

The controller 24 operably couples to the multiplexor 32, the plurality of shift control lines 18, and the bit reversal control line 22. Controller 24 provides multiplexor control signals to the multiplexor 32 to enable the operation of the multiplexor 32 for various shifting operations performed by the circuit 40. Multiplexor control signal is preferably a multi-bit signal having sufficient width to uniquely enable the various operations of the multiplexor 32. The controller 24 also provides shifting control signals 18 to the plurality of shifting transistors 16 so as to selectively enable the shifting transistors to provide a shifted representation of the input data $D_0$ through $D_3$ to the plurality of output lines 14 as output data $O_0$ through $O_3$. Further, the controller 24 provides the bit reversal signal 22 to the plurality of bit reversal transistors 20 so as to provide a bit reversal representation of the input data $D_0$ through $D_3$ to the output lines 14 $O_0$ through $O_3$.

The circuit 40 further includes pre-charge circuitry 30 for precharging the output lines 14 during an operation circuit 40. As previously discussed, the pre-charge circuitry 30 precharges the output lines 14 so that the data lines 34 may be driven statically.

The circuit 40 illustrated in FIG. 3 is often referred to as a "snaked data barrel shifter" due to the methodology in which input data is provided to the shifting transistor 16. Data lines 34 are referred to as $IR_0$, $IR_1$, $IR_2$, $IR_3$, $IL_0$, $IL_1$, $IL_2$. The data lines 34 receive input data from the multiplexor 32 based upon the particular shifting operation performed by the circuit 40.

Figure 4:
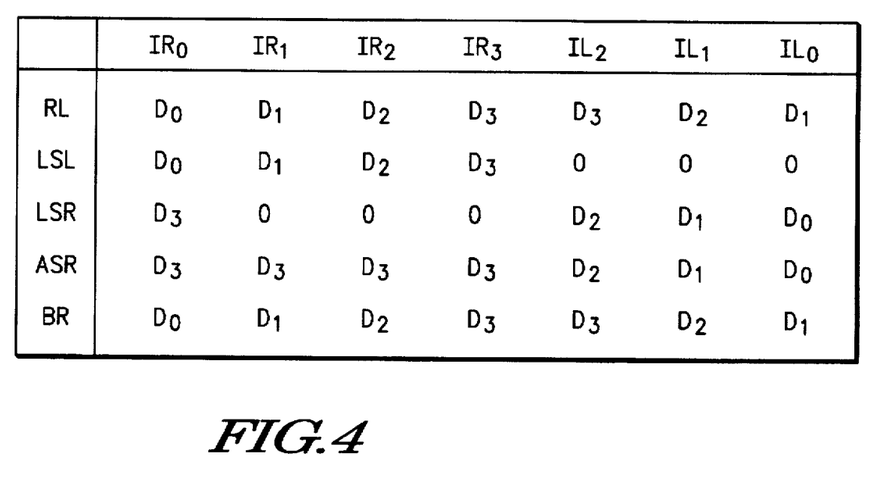
FIG. 4 illustrates a logic table for implementing shifts and bit reversals in accordance with the circuit of FIG. 3.

FIG. 4 illustrates the data provided to each of the data lines 34 by the multiplexor 32 during particular operations of the circuit 40. Each row of information conveyed in FIG. 4 relates to a particular shifting operation performed by the circuit 40 of FIG. 3. Each column of the table of FIG. 4 indicates the data bit, $D_0$ through $D_3$ provided to the data lines 34 $IR_0$, $IR_1$, $IR_2$, $IR_3$, $IL_0$, $IL_1$, $IL_2$ for the particular shifting operation.

In the first row of table FIG. 4, for a rotate left or RL operation of circuit 40, data $D_0$ is provided to data line $IR_0$, data $D_1$ is provided to $IR_1$, $D_2$ is provided to $IR_2$, $D_3$ is provided to $R_3$, $D_3$ is provided to $IL_2$, $D_2$ is provided to $IL_1$, and $D_1$ is provided to $IL_0$. Once the data is provided to the data lines 34 in the fashion described in FIG. 4, the magnitude to the shift is accomplished by enabling one of the shift control lines 18 $S_0$ through $S_3$. For example, for an RL shift having a magnitude 0, control line $S_0$ is enabled. For a shift magnitude of 1, $S_1$ is enabled, for a shift magnitude 2, $S_2$ is enabled, and for a shift magnitude of 3, $S_3$. In this fashion, the multiplexor 32 provides input data to the data lines 34 in a consistent fashion for each of the various shift operations of the circuit 40. The magnitude to the shift operation therefore is controlled simply by enabling one of various control lines 18 of the circuit 40.

FIG. 4 further illustrates the application of input data to the data lines 34 for the logical shift left (LSL), logical shift right (LSR), and arithmetic shift right (ASR) operations of the circuit 40. In each of these shifting operations, the data is applied in a consistent fashion and the magnitude of the shift is controlled by the selective enablement of control lines 18.

With respect to bit reversal operations of circuit 40, input data is applied to the data lines 34 as illustrated in FIG. 4 and the bit reversal control line 22 is enabled. In this fashion, a bit reversed representation of the input data is provided to the output lines 14. As one skilled in the art will readily appreciate, the teachings provided in FIG. 4 could be readily applied to larger implementations of the circuit 40 illustrated in FIG. 3 to provide shifting operations and bit reversal operations for data having a width of greater than 4 bits.

Figure 5:
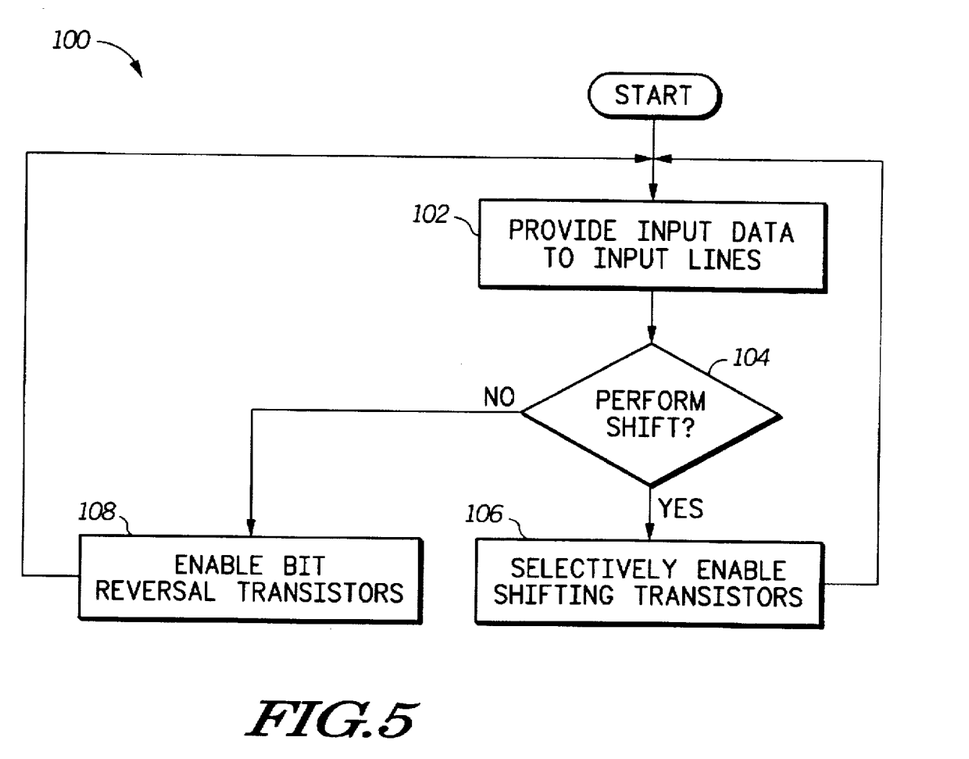
FIG. 5 illustrates a method for selectively implementing shifts and bit reversals of input data in accordance with the present invention.

FIG. 5 illustrates a logic diagram of a method 100 for selectively implementing shifts and bit reversals of input data in accordance with the present invention. The method commences at step 102 wherein the method includes providing input data to a plurality of input lines, wherein each of the input lines receives one bit of the input data. The method proceeds to decision block 104 wherein it is determined whether a shift is to be performed. If a shift is to be performed, the method proceeds to block 106 wherein the step of providing input data and selectively enabling a plurality of shifting transistors is accomplished. In this step, the selective enablement of the plurality of shifting transistors provides a shifted representation of the input data to a plurality of output lines, wherein each of the plurality of shifting transistors operably couples one of the plurality of input lines to one of the plurality of output lines. In accordance with the present invention, step 106 may include various shifting operations as have been previously described with respect to the circuit of the present invention. From step 106, the method proceeds to step 108.

If at decision step 104, no shifting operation is to be performed, the method also proceeds to step 108. At step 108, the method includes selectively providing input data to the input lines and enabling a plurality of bit reversal transistors. Each of the plurality of bit reversal transistors operably couples one of the plurality of input lines to one of the plurality of output lines. Upon an enablement, the bit reversal transistors provide bit reversed representation of the input data to the plurality of output lines. In this fashion, the method 100 of the present invention provides both shifts and bit reversals of an input data at an output. The method of the present invention preferably further includes the step of multiplexing input data to selectively provide the input data to the plurality of input lines.

Thus, the method of the present invention provides the important benefit of operating a circuit to perform both bit reversal and shifting operations, the multiple functions performed by a common circuit reducing the complexity and power consumption of the associated circuitry while potentially increasing speed. It is important to note that plurality, as used herein, is intended to mean and integer value between 2 and infinity and should not be limited to any particular sub-range or constant. While the present invention has been illustrated and described with reference to specific embodiments, further modifications and improvements will occur to those skilled in the art. Transistor, as used herein, means any switching means capable of being selectively turned off and on, or changed in resistance. It is to be understood, therefore, that this invention is not limited to the particular forms illustrated and that it is intended in the appended claims to cover all modifications that do not depart from the spirit and scope of this invention.

What is claimed is:

1. A circuit for implementing a bit reversal of an input data, the circuit comprising:

a plurality of input lines, wherein each of the input lines receives one bit of the input data;

a plurality of output lines, wherein each of the output lines provides one bit of output data;

a first plurality of transistors operably coupling the plurality of input lines to the plurality of output lines, wherein each of the transistors within the first plurality of transistors operably couples one of the plurality of input lines to one of the plurality of output lines to perform rotational or shift operations on input data on the plurality of input lines;

a plurality of shift/rotate control lines coupled to the first plurality of transistors so that a rotated or shifted representation of the input data is provided on the plurality of output lines;

a second plurality of transistors operably coupled between the plurality of input lines and the plurality of output lines wherein each of the transistors within the second plurality of transistors operably couples one of the plurality of input lines to one of the plurality of output lines to perform bit reversal of the input data on the plurality of input lines;

a bit reversal control line operably coupled to the second plurality of transistors, wherein the bit reversal control line receives a bit reversal signal and provides the bit reversal signal to the second plurality of transistors so that a bit reversed representation of the input data is produced on the plurality of output lines; and a controller operably coupled to provide signals on the bit reversal control line and on the plurality of shift/rotate control lines, wherein the bit reversal controller provides the bit reversal signal to the bit reversal control line and selectively provides enable signals to the plurality of shift/rotate control lines.

2. The circuit of claim 1, further comprising pre-charge circuitry, wherein the pre-charge circuitry provides a pre-charge signal to control each of the output lines prior to an application of the bit reversal signal.

3. The circuit of claim 1, wherein the plurality of input lines comprise 32 lines.

4. The circuit of claim 1, further comprising pre-charge circuitry, wherein the pre-charge circuitry provides a pre-charge signal to control each of the output lines in the plurality of output lines prior to an application of the bit reversal signal wherein the pre-charge circuitry selectively precharges the plurality of output lines to reduce power consumption.

5. The circuit of claim 1, wherein the plurality of input lines comprise 16 lines.

6. The circuit of claim 1, wherein the first plurality of transistors comprises K transistors where K in a finite positive integer and wherein the second plurality of transistors comprises SORT(K) transistors where SORT(K) is an integer value equal to the square root of K.

7. The circuit of claim 1, wherein the plurality of transistors comprise N-channel field effect transistors wherein input data flowing from the plurality of input lines to the plurality of output lines passes through only one N-channel transistor in series between the plurality of input lines and the plurality of output lines.

8. A circuit for selectively implementing shifts and bit reversals of input data, the circuit comprising:

a plurality of input lines, wherein each of the input lines receives one bit of the input data;

a plurality of output lines, wherein each of the output lines provides one bit of output data;

a plurality of shifting transistors operably coupling the plurality of input lines to the plurality of output lines, wherein each of the plurality of shifting transistors operably couples one of the plurality of input lines to one of the plurality of output lines;

a plurality of shift control lines operably coupled to the plurality of shifting transistors, wherein the shift control lines provide shift control signals to the plurality of shifting transistors;

a plurality of bit reversal transistors operably coupling the plurality of input lines to the plurality of output lines, wherein when the bit reversal transistors are enabled by a bit reversal signal, a bit reversed representation of the input data is produced on the plurality of output lines; and a bit reversal control line operably coupled to the plurality of bit reversal transistors, wherein the bit reversal control line receives the bit reversal signal and provides the bit reversal signal to the plurality of bit reversal transistors; and a controller operably coupled to the plurality of shift control lines and the bit reversal control line, wherein the controller provides shift control signals to the shift control lines to selectively enable the plurality of shifting transistors to provide a shifted representation of the input data to the plurality of output lines, and wherein the controller selectively provides the bit reversal signal to the bit reversal control line.

9. The circuit of claim 8 further comprising pre-charge circuitry, wherein the pre-charge circuitry provides a pre-charge signal to each of the output lines prior to an operation of the controller.

10. The circuit of claim 8, wherein the plurality of input lines comprise 32 lines.

11. The circuit of claim 10, wherein the plurality of bit reversal transistors comprises 32 transistors.

12. The circuit of claim 8, wherein the plurality of input lines comprise 16 lines.

13. The circuit of claim 12, wherein the plurality of bit reversal transistors comprises 16 transistors.

14. The circuit of claim 8, wherein the plurality of shifting transistors and the plurality of bit reversal transistors comprise N-channel field effect transistors.

15. The circuit of claim 8, wherein the shifting control signals comprise instructions for performing shift operations selected from the group consisting of logical shift left (LSL), logical shift right (LSR), arithmetic shift right (ASR), and rotate shifts (RS).

16. A circuit for selectively implementing shifts and bit reversals of input data, the circuit comprising:

a plurality of input lines, wherein each of the input lines receives a bit of the input data;

multiplexor operably coupled to the plurality of input lines, wherein the multiplexor selectively multiplexes the input data depending upon a shift operation to be performed, to produce a multiplexor output signal;

a plurality of data lines operably coupled to the multiplexor, wherein each of the plurality of data lines receives one bit of the multiplexor output signal;

a plurality of output lines, wherein each of the output lines provides a bit of output data;

a plurality of shifting transistors operably coupling the plurality of data lines to the plurality of output lines, wherein each of the plurality of shifting transistors operably couples one of the data lines to one of the plurality of output lines;

a plurality of shift control lines operably coupled to the plurality of shifting transistors;

a plurality of bit reversal transistors operably coupling a portion of the data lines to the plurality of output lines, wherein when the bit reversal transistors are enabled by a bit reversal signal, the bit reversal transistors provide a reversed bit representation of the input data to the plurality of output lines;

a bit reversal control line operably coupled to the plurality of bit reversal transistors, wherein the bit reversal control line receives a bit reversal signal and provides the bit reversal signal to the plurality of bit reversal transistors; and a controller operably coupled to the multiplexor, the plurality of shift control lines, and the bit reversal control line, wherein the controller provides shifting control signals to the multiplexor and the plurality of shifting transistors so as selectively enable the plurality of shifting transistors to provide a shifted representation of the input data to the plurality of output lines, and wherein the controller selectively provides the bit reversal signal to the bit reversal control line.

17. The circuit of claim 16 further comprising pre-charge circuitry, wherein the pre-charge circuitry provides a pre-charge signal to each of the output lines prior to an operation of the controller.

18. The circuit of claim 16, wherein the plurality of input lines comprise 32 lines.

19. The circuit of claim 18, wherein the plurality of bit reversal transistors comprises 32 transistors.

20. The circuit of claim 16, wherein the plurality of input lines comprise 16 lines.

21. The circuit of claim 20, wherein the plurality of bit reversal transistors comprises 16 transistors.

22. The circuit of claim 16, wherein the plurality of transistors comprise N-channel field effect transistors.

23. The circuit of claim 16, wherein the shifting control signals comprise instructions for causing shift operations selected from a group consisting of logical shift left (LSL), logical shift right (LSR), arithmetic shift right (ASR), and rotate shifts (RS).

24. A method for selectively implementing shifts and bit reversals of input data, the circuit comprising:

(a) providing input data to a plurality of input lines, wherein each of the input lines receives one bit of the input data;

(b) selectively enabling a plurality of shifting transistors so as to provide a shifted representation of the input data to a plurality of output lines, wherein each of the plurality of shifting transistors operably couples one of the plurality of input lines to one of the plurality of output lines; and (c) selectively enabling a plurality of bit reversal transistors, wherein each of the plurality of bit reversal transistors operably couples one of the plurality of input lines to one of the plurality of output lines, and wherein the bit reversal transistors provide a bit reversed representation of the input data to the plurality of output lines when enabled.

25. The method of claim 24, wherein providing input data to a plurality of input lines further comprises the step of multiplexing the input data to selectively provide the input data to the plurality of input lines.

26. A circuit for selectively implementing shifts and bit reversals of input data, the circuit comprising:

a plurality of multiplexors providing a plurality of multiplexor output lines, each multiplexor in the plurality of multiplexors having a plurality of data inputs which are multiplexed to one multiplexor output line in the plurality of multiplexor output lines;

N input lines, which include the plurality of multiplexor output lines, where N is a finite positive integer;

N output lines;

N×N shift transistors wherein the N×N shift transistors are connected to allow any one of the N input lines to be selectively coupled to any one of the N output lines;

N bit reversal transistors wherein each bit reversal transistor is coupled between one of the N output lines and one of the N input lines so that no two bit reversal transistors are coupled to a same output line and input line; and wherein the N bit reversal transistors allow bits provided on the N input lines to be transferred to the N output lines in a reversed bit order, and the N×N shift transistors allowing bits provided on the N input lines to be transferred to the N output lines in a shifted order wherein the N bit reversal transistors are enabled mutually exclusive in time from the N×N shift transistors to avoid bit contention on the N output lines.

27. The circuit of claim 26 further comprising:

a controller having M output control signals, wherein M is greater than N, each of the N×N shift transistors being coupled to one of the M output control signals to control the shifted order.

28. The circuit of claim 27 wherein the M output control signals allow for rotate operations, arithmetic shift operations, and logical shift operations.

29. The circuit of claim 26 wherein each of the N output lines are coupled through a precharge transistor to a voltage potential, each precharge transistor being gated by a signal from a precharge control circuit so that the N output lines are driven statically.

30. A circuit for selectively implementing shifts and bit reversals of input data, the circuit comprising:

a controller providing N shift control lines, one bit reversal control line, and a plurality of switch control lines, N being a finite positive integer;

switching means having N data inputs and M data outputs, M being a finite positive integer greater than N, the M data outputs containing data values provided by the N data inputs in some order determined by control values received by the plurality of switch control lines;

N×N switching transistors arranged in an array format wherein each of the N×N switching transistors is gated by one of the N shift control lines, each of the N×N switching transistors being coupled between one of the M data outputs and a unique one of N output lines;

N bit reversal transistors wherein each one of the N bit reversal transistors is coupled between a unique pair of lines wherein the pair of lines contains: (1) one of the N output lines; and (2) one of the M data outputs; and wherein the N bit reversal transistors allow bits provided via N of the M data outputs to be transferred to the N output lines in a reversed bit order when compared to the N data inputs, and the N×N shift transistors allowing bits provided on several of the M input lines to be transferred to the N output lines in a shifted order wherein the N bit reversal transistors are enabled substantially mutually exclusive in time from the N×N shift transistors to avoid bit contention on the N output lines.

31. The circuit of claim 30 wherein each of the N output lines are coupled through a precharge transistor to a voltage potential, each precharge transistor being gated by a signal from a precharge control circuit so that the N output lines are driven statically.

* * * * *

UNITED STATES PATENT AND TRADEMARK OFFICE
CERTIFICATE OF CORRECTION

PATENT NO: 5,682,340

DATED: Oct. 28, 1997

INVENTORS: John Arends and Jeffrey W. Scott

It is certified that error appears in the above-identified patent and that said Letters Patent is hereby corrected as shown below:

Column 10, line 46 change "in" to --is--
Column 10, line 48 change "SORT(K)" to --SQRT(K)-- as it appears twice Signed and Sealed this Twenty-fourth Day of March, 1998

Attest:

BRUCE LEHMAN

*Attesting Officer*     *Commissioner of Patents and Trademarks*